(12) United States Patent
Xi

US009655209B1

(10) Patent No.: US 9,655,209 B1
(45) Date of Patent: May 16, 2017

(54) CONSTANT CURRENT AND TEMPERATURE COMPENSATION CONTROL DEVICE FOR OUTDOOR SPOTLIGHTS USED ON LASER STAGES

(71) Applicant: Jun Xi, Dongguan (CN)

(72) Inventor: Jun Xi, Dongguan (CN)

( * ) Notice: Subject to any disclaimer, the term of this patent is extended or adjusted under 35 U.S.C. 154(b) by 0 days.

(21) Appl. No.: 15/203,983

(22) Filed: Jul. 7, 2016

(30) Foreign Application Priority Data

Apr. 1, 2016 (CN) .......................... 2016 1 0207559

(51) Int. Cl.
| | |
|---|---|
| *H05B 37/02* | (2006.01) |
| *H05B 33/08* | (2006.01) |
| *F21S 8/00* | (2006.01) |
| *H01S 5/042* | (2006.01) |
| *F21Y 115/30* | (2016.01) |
| *F21Y 113/10* | (2016.01) |
| *F21W 131/105* | (2006.01) |

(52) U.S. Cl.
CPC .......... *H05B 37/0227* (2013.01); *F21S 8/003* (2013.01); *H01S 5/042* (2013.01); *H05B 33/0815* (2013.01); *H05B 33/0842* (2013.01); *H05B 33/0884* (2013.01); *F21W 2131/105* (2013.01); *F21Y 2113/10* (2016.08); *F21Y 2115/30* (2016.08)

(58) Field of Classification Search
CPC H05B 37/02; H05B 37/0227; H05B 33/0815; H05B 33/0884; H05B 33/0842; F21Y 2115/30; F21Y 2113/10; F21S 8/003; H01S 5/042; F21W 2131/105

USPC ................................................... 315/291, 53
See application file for complete search history.

(56) References Cited

U.S. PATENT DOCUMENTS

| | | | | |
|---|---|---|---|---|
| 4,845,342 A * | 7/1989 | Chen | .................. | G05D 23/2401 219/494 |
| 2007/0024213 A1* | 2/2007 | Shteynberg | ........ | H05B 33/0815 315/291 |
| 2007/0085494 A1* | 4/2007 | Takeda | ............... | H05B 33/0815 315/316 |
| 2007/0210722 A1* | 9/2007 | Konno | ............... | H05B 33/0803 315/185 S |
| 2008/0150488 A1* | 6/2008 | Lu | ......................... | H02J 7/0031 320/134 |
| 2011/0085576 A1* | 4/2011 | Crawford | ........... | H05B 33/0818 372/38.07 |
| 2012/0081009 A1* | 4/2012 | Shteynberg | .......... | H05B 33/083 315/122 |
| 2012/0153844 A1* | 6/2012 | Chobot | ................ | H05B 33/083 315/185 R |

(Continued)

*Primary Examiner* — Don Le
(74) *Attorney, Agent, or Firm* — Hemisphere Law, PLLC

(57) ABSTRACT

The present invention provide a constant current and temperature compensation control device for outdoor spotlights used on laser stages which includes a single chip microcomputer, a triode or an field effect transistor, a laser LED light, a heating piece and a driving triode used for driving the heating piece. The benefits of the present invention include protecting the laser light from damage caused by power surge which results in no light or weakened light intensity, saving the cost of a specialized current limiting chip, making the green laser module work normally in extremely cold outdoor environment thus being more favorable to apply this device to mood creating lights of Christmastime.

8 Claims, 2 Drawing Sheets

(56) References Cited

U.S. PATENT DOCUMENTS

2012/0200229 A1* 8/2012 Kunst ................ H05B 33/0815
                                                    315/186
2015/0015143 A1* 1/2015 Inada ................. H05B 33/0815
                                                    315/77

* cited by examiner

CONSTANT CURRENT AND TEMPERATURE COMPENSATION CONTROL DEVICE FOR OUTDOOR SPOTLIGHTS USED ON LASER STAGES

BACKGROUND OF THE INVENTION

1. Field of the Invention

The present invention relates to outdoor illumination devices, and more particularly to a constant current and temperature compensation control device for outdoor spotlights used on laser stages.

2. Description of Related Art

Laser spotlights are commonly classified into stage laser spotlights and outdoor laser spotlights. Having advantages such as vivid color, high brightness, good directivity, long range, better control and so on, laser lights invoke feelings of dreaminess and can be used in buildings, parks, squares, theaters, stages, etc. Since laser beams have no divergence, laser lights can draw people's attention from miles away thus making the laser starting point becoming the focus of people's attention.

Presently, most stage laser lights are classified into outdoor type and indoor type. Stage laser lights can also be a kind of laser products which could automatically make various laser beams, laser patterns and laser characters according to the tempo of the music. This laser product is a new product which is often used to warm up atmosphere of stages, dance halls, bars, KTVs, theaters, television stations, concerts and homes. Sorted by color, it can be commonly classified into monochromatic laser lights, two-color laser lights, three-color laser lights, full-color laser lights, colorful laser lights, animation laser lights and so on.

All Laser lights sold on the market nowadays only adopt a simple current limiting circuit using seriesly connected resistors thus resulting in numerous deficiencies:

Firstly, this kind of circuit only provides simple protection for laser lights, the voltage and current of laser lights can be greatly influenced by voltage fluctuation of power supplies, meanwhile leading to damage of laser lights since laser light intensity is easily weakened in the process of using.

Secondly, according to actual application experience, most specialized laser light control chips are very expensive, being not suitable for laser stage lights used at homes.

Thirdly, as for green laser lights, temperature influences the service life of them, either lower or higher temperature can cause damage or aging on laser LEDs.

Therefore, to solve the above problems, effective improvements should be made to the prior art.

BRIEF DESCRIPTION OF THE SEVERAL VIEWS OF THE DRAWING(S)

The foregoing and other exemplary purposes, aspects and advantages of the present invention will be better understood in principle from the following detailed description of one or more exemplary embodiments of the invention with reference to the drawings, in which.

DETAILED DESCRIPTION OF THE INVENTION

The invention will now be described in detail through several embodiments with reference to the accompanying drawings.

Figure 1:
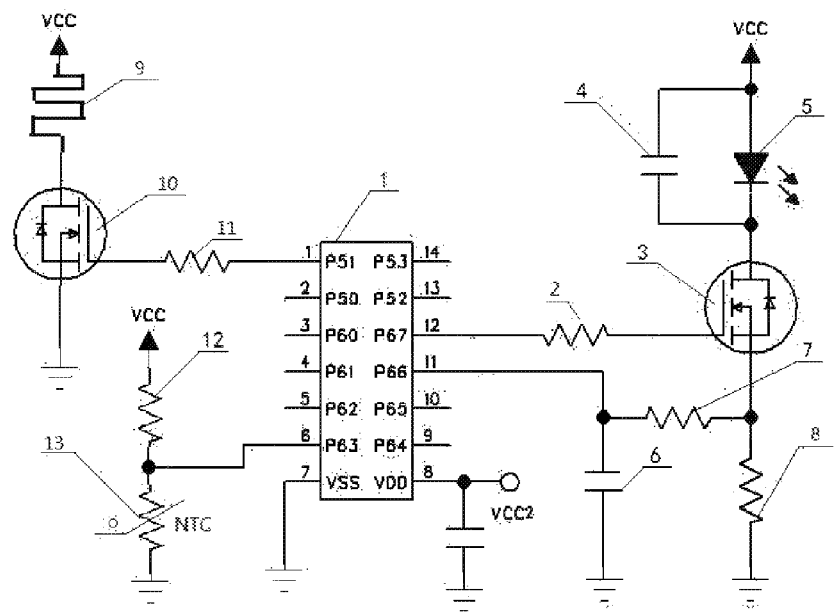
FIG. 1 is a schematic diagram of the constitution of the control device in accordance with an embodiment of the present invention.

Please refer to FIG. 1, a constant current and temperature compensation control device for outdoor spotlights used on laser stages in accordance with an embodiment of the present invention mainly includes a single chip microcomputer 1, a switching tube 3, a laser LED light 5, a heating piece 9, a driving triode 10 used for driving the heating piece 9, a current detecting circuit and a temperature detecting circuit.

The single chip microcomputer 1 at least includes a first output pin (pin 12 in FIG. 1) used for controlling the laser LED light 5 via the switching tube 3, a second output pin (pin 1 in FIG. 1) used for controlling the heating piece 9 via the driving triode 10, a first input pin (pin 11 in FIG. 1) used as a first detecting pin for detecting a current flowing through the laser LED light 5, and a second input pin (pin 6 in FIG. 1) used as a second detecting pin for detecting an inner temperature of an outdoor spotlight using the constant current and temperature compensation control device.

An anode of the laser LED light 5 is connected with a power supply terminal VCC of a power supply circuit (not shown) of the control device. A cathode of the laser LED light 5 is connected with a first pin of the switching tube 3. A filter capacitor 4 is connected with the laser LED light 5 in parallel. A control pin of the switching tube 3 is connected with the first output pin of the single chip microcomputer 1 via a current limiting resistor 2. A second pin of the switching tube 3 is connected with the current detecting circuit.

The single chip microcomputer 1 can detect the current flowing through the laser LED light 5 via the current detecting circuit. In the embodiment, the current detecting circuit includes a filter resistor 7, a sampling resistor 8 and a sampling filter capacitor 6. The first input pin (pin 11 in FIG. 1) of the single chip microcomputer 1 is connected with a terminal of the sampling filter capacitor 6 and the filter resistor 7. The other terminal of the sampling filter capacitor 6 is grounded, and the other terminal of the filter resistor 7 is connected with a terminal of the sampling resistor 8 and the second pin of the switching tube 3. The other terminal of the sampling resistor 8 is grounded.

As for constant current control function, the control device of the outdoor spotlight used on laser stages utilizes the single chip microcomputer 1 to determine/calculate the current flowing through the laser LED light 5 based on a detected voltage across the sampling filter capacitor 6 (or the sampling resistor 8 from another view). The single chip microcomputer 1 then outputs a PWM signal with an appropriate period/width via its first output pin to control the switching tube 3 to maintain a constant current control of the laser LED light 5.

In the embodiment, the switching tube 3 may be a triode or a field effect transistor (FET). When the switching tube 3 is a PNP type triode, the first pin of the switching tube 3 is a collector, the second pin is an emitter, and the control pin is a base. When the switching tube 3 is an FET, the first pin of the switching tube 3 is a drain electrode, the second pin is a source electrode, and the control pin is a grid electrode.

The heating piece 9 is used for heating the air within the outdoor spotlight using the constant current and temperature compensation control device or an inner temperature of a receiving cavity housing at least the laser LED light 5, the heating piece 9 and the temperature detecting circuit. A terminal of the heating piece 9 is connected with the power supply terminal VCC, and the other terminal of the heating piece 9 is connected with the driving triode 10. The driving triode 10 is a PNP type triode, its collector is connected with the heating piece 9, its emitter is grounded, and its base is connected with the second output pin (the pin 1 in FIG. 1) of the single chip microcomputer 1 via a current limiting resistor 11.

The constant current and temperature compensation control device further includes the temperature detecting circuit used for detecting the inner temperature of the outdoor spotlight or an inner temperature of a receiving cavity housing at least the laser LED light 5, the heating piece 9 and the temperature detecting circuit. The temperature detecting circuit includes an NTC (Negative Temperature Coefficient) temperature sensor 13 and a voltage dividing resistor 12 connected in series with the temperature sensor 13. The other terminal of the voltage dividing resistor 12 is connected to the voltage supply terminal VCC. The other terminal of the temperature sensor 13 is grounded, and a connected point between the voltage dividing resistor 12 and the temperature sensor 13 is connected to the second input pin (pin 6 in FIG. 1) of the single chip microcomputer 1.

As for temperature control function, when in outdoor cold winter environment, after the outdoor spotlight is powered on, the single chip microcomputer 1 detects the inner temperature of the outdoor spotlight via the NTC temperature sensor 13. When a detected inner temperature value is lower than a preset minimum safety temperature value, the driving triode 10 is switched on, and the heating piece 9 is power to heat the air within the outdoor spotlight or only with a laser module sealing at least the laser LED light 5, the temperature detecting circuit and the heating piece 9. When the detected inner temperature value reaches a preset normal working temperature value of the laser LED light 5, the driving triode 10 is switched off, and the heating piece 9 stops working.

A constant current and temperature compensation control device for outdoor spotlights used on laser stages of the present invention mentioned above, as for the constant current part for the laser LED of the device, a sampling resistor is seriesly connected in the laser light circuit, the single chip microcomputer samples voltage signal and calculates working current of the laser light, then based on the difference of sampled values, the single chip microcomputer outputs a PWM signal to accomplish constant current control, moreover the single chip microcomputer buffers according to the lightening curve of the laser light thus making modulation smoothly therefore illuminating, protecting the laser light from being damaged caused by current surge effectively.

As for the temperature compensation part for the laser LED of the device, by adopting temperature detecting and control circuit for the laser LED, control circuit of the laser light detects the temperature of the laser module after powered on, if the detected temperature value is lower than a preset minimum safety temperature value, the control circuit makes the heating piece heat the laser module and when the detected temperature value reaches a preset normal working temperature value, the heating progress of the laser module is stopped. As for the heating condition of the laser module itself, if the temperature value of the laser module itself reaches 40° C. which is abnormal, the operation of the laser LED is stopped to prevent high temperature damage.

Figure 2:
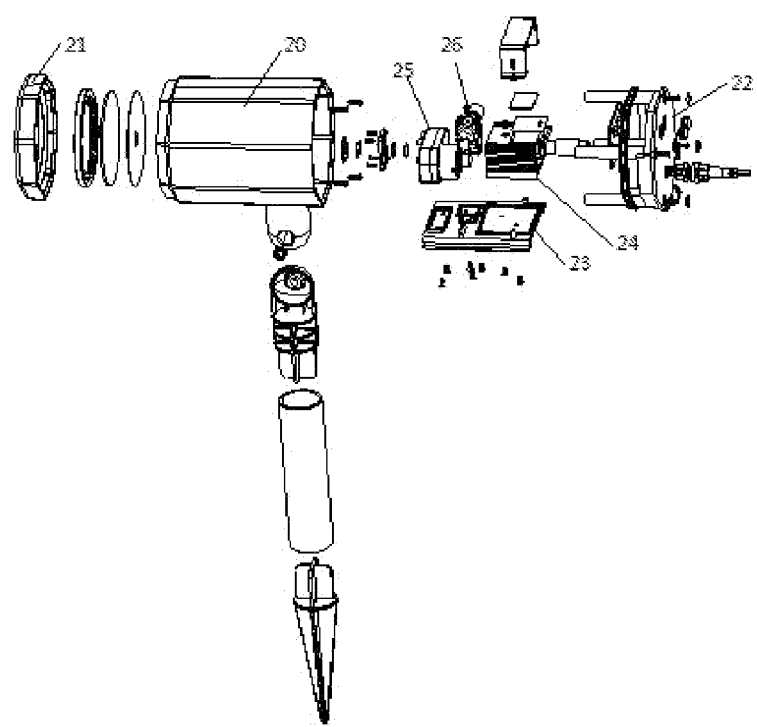
FIG. 2 is an exploded view of an outdoor spotlights having the control device in accordance with an embodiment of the present invention.

Please refer to FIG. 2, a constant current and temperature compensation control device in accordance with an embodiment of the present invention can be applied to a heat-generating parts of an outdoor spotlight used on laser stages. The spotlight mainly includes a light body 20, a front cover 21 and a rear cover 22. The front cover 21 is fixed in front of the light body 20 and the rear cover 22 fixed in the rear side. A light transmission window is fixed on the surface of the front cover 21, a glass cover is mounted on the light transmission window. A middle plate 23 is mounted in a chamber of the light body 20. The middle plate 23 has fixed grooves on its surface. A gear box 24 and a second radiator 25 are respectively mounted on a left fixed groove and a right fixed groove. A first radiator 26 is placed in a groove between the gear box 24 and the second radiator 25. Two fixed sheets are provided outside the gear box 24. Two optical grating sheets are mounted respectively on the two fixed sheets. One optical grating sheet has a pattern of starlight; and the other optical grating sheet has a pattern of figures. A red laser head is mounted outside the first radiator. A temperature sensor is mounted on the edge of the second radiator 25. A heating piece is placed on the surface of the second radiator 25.

To sum up, the advantages of the present invention are listed below.

Firstly, the device is constituted by several main modules thus making the laser light protected from damage caused by power surge which results in no light or weakened light intensity, on the other hand, by adopting a single chip microcomputer to accomplish current limiting protection can save the cost of a specialized current limiting chip the same time benefit using a software to solve the problem that existing current limiting chips can not realize laser lights starting based on nonlinear lightening curve;

Secondly, by adopting heating and temperature detecting circuit, the green laser module can work normally in extremely cold outdoor environment, thus being more favorable to apply this device to mood creating lights of Christmastime.

While the invention has been described in terms of several exemplary embodiments, those skilled on the art will recognize that the invention can be practiced with modification within the spirit and scope of the appended claims. In addition, it is noted that, the Applicant's intent is to encompass equivalents of all claim elements, even if amended later during prosecution.

What is claimed is:

1. A constant current and temperature compensation control device for outdoor spotlights used on laser stages, comprising:
   a laser LED light;
   a switching tube connected in series with the laser LED light;
   a current detecting circuit configured for detecting a current flowing through the laser LED light;
   a heating piece;
   a driving triode connected in series with the heating piece;
   a temperature detecting circuit configured for detecting an inner temperature of a receiving cavity housing at least the laser LED light, the heating piece and the temperature detecting circuit; and
   a single chip microcomputer comprising:
   a first input pin connected with the current detecting circuit;
   a first output pin connected with the switching tube and configured for controlling an on-off state of the switching tube to realize a constant current control of the laser LED light based on an detected value of the current detecting circuit;

a second input pin connected with the temperature detecting circuit; and a second output pin connected with the driving triode and configured for controlling an on-off state of the driving triode to realize a temperature control within the receiving cavity.

2. The control device of claim 1, wherein an anode of the laser LED light is connected with a power supply terminal, a cathode of the laser LED light is connected with a first pin of the switching tube, and a filter capacitor is connected with the laser LED light in parallel; a control pin of the switching tube is connected with the first output pin of the single chip microcomputer via a current limiting resistor, and a second pin of the switching tube is connected with the current detecting circuit.

3. The control device of claim 2, wherein the current detecting circuit comprises a filter resistor, a sampling resistor and a sampling filter capacitor, the first input pin of the single chip microcomputer is connected with a terminal of the sampling filter capacitor and the filter resistor; the other terminal of the sampling filter capacitor is grounded, and the other terminal of the filter resistor is connected with a terminal of the sampling resistor and the second pin of the switching tube; the other terminal of the sampling resistor is grounded.

4. The control device of claim 3, wherein the switching tube is one of a triode and a field effect transistor; when the switching tube is a PNP type triode, the first pin of the switching tube is a collector, the second pin is an emitter, and the control pin is a base; when the switching tube is an FET, the first pin is a drain electrode, the second pin is a source electrode, and the control pin is a grid electrode.

5. The control device of claim 1, wherein a terminal of the heating piece is connected with a power supply terminal, and the other terminal of the heating piece is connected with the driving triode.

6. The control device of claim 5, wherein the driving triode is a PNP type triode, its collector is connected with the heating piece, its emitter is grounded, and its base is connected with the second output pin of the single chip microcomputer via a current limiting resistor.

7. The control device of claim 1, wherein the temperature detecting circuit comprises an NTC temperature sensor and a voltage dividing resistor connected in series with the temperature sensor; the other terminal of the voltage dividing resistor is connected to a voltage supply terminal; the other terminal of the temperature sensor is grounded, and a connected point between the voltage dividing resistor and the temperature sensor is connected to the second input pin of the single chip microcomputer.

8. The control device of claim 1, wherein the first output pin outputs a PWM signal to the switching tube for realizing the constant current control of the laser LED light based on the detected value of the current detecting circuit.

* * * * *